United States Patent
Zhu

(10) Patent No.: US 11,200,020 B2
(45) Date of Patent: Dec. 14, 2021

(54) INTELLIGENT WEARABLE DEVICE

(71) Applicant: JRD COMMUNICATION (SHENZHEN) LTD, Shenzhen (CN)

(72) Inventor: Lin Zhu, Shenzhen (CN)

(73) Assignee: JRD COMMUNICATION (SHENZHEN) LTD, Shenzhen (CN)

( * ) Notice: Subject to any disclaimer, the term of this patent is extended or adjusted under 35 U.S.C. 154(b) by 45 days.

(21) Appl. No.: 16/614,794

(22) PCT Filed: Jun. 12, 2018

(86) PCT No.: PCT/CN2018/090817
§ 371 (c)(1),
(2) Date: Nov. 18, 2019

(87) PCT Pub. No.: WO2018/228372
PCT Pub. Date: Dec. 20, 2018

(65) Prior Publication Data
US 2020/0196719 A1   Jun. 25, 2020

(30) Foreign Application Priority Data

Jun. 12, 2017 (CN) .......................... 201710439875.5

(51) Int. Cl.
*G06F 3/14*   (2006.01)
*G06F 3/147*   (2006.01)
(Continued)

(52) U.S. Cl.
CPC .............. *G06F 3/147* (2013.01); *G06F 1/163* (2013.01); *G06F 1/1647* (2013.01);
(Continued)

(58) Field of Classification Search
CPC ........ G06F 1/163; G06F 1/1652; G06F 3/147; G06F 1/1647; G06F 3/1423; H05K 1/147; H05K 5/0017
See application file for complete search history.

(56) References Cited

U.S. PATENT DOCUMENTS 7,212,413 B2 *  5/2007  Chang ................. G02F 1/13452
                                                    174/254
7,259,823 B2 *  8/2007  Wu ...................... G02F 1/13452
                                                    349/150
(Continued)

FOREIGN PATENT DOCUMENTS

| CN | 201477324 U | 5/2010 |
|---|---|---|
| CN | 203014919 U | 6/2013 |

(Continued)

OTHER PUBLICATIONS

International search report,PCT/CN2018/090817, dated Sep. 19, 2018 (3 pages).
(Continued)

*Primary Examiner* — Rockshana D Chowdhury
*Assistant Examiner* — Douglas R Burtner

(57) ABSTRACT

An intelligent wearable device includes a housing (1) and a display unit (2) mounted on the housing (1). The display unit (2) includes a first display screen (21) and a second display screen (22). The first display screen (21) is a flexible display screen, and the first display screen (21) includes a first display area (211), a bendable area (212) and a second display area (213) which are sequentially connected, wherein the first display area (211) and the second display area (213) are foldably connected to each other by means of the bendable area (212), and a back face of the first display area (211) is connected to the housing (1). The second display screen (22) is an electronic ink screen, and a back
(Continued)

face of the second display screen (22) is connected to a back face of the second display area (213) in a laminated manner.

19 Claims, 1 Drawing Sheet

(51) Int. Cl.
  *G06F 1/16* (2006.01)
  *H01L 51/52* (2006.01)
  *H05K 1/14* (2006.01)
  *H05K 5/00* (2006.01)
  *A44C 5/00* (2006.01)

(52) U.S. Cl.
  CPC .......... *G06F 1/1652* (2013.01); *G06F 3/1423* (2013.01); *H01L 51/5237* (2013.01); *H05K 1/147* (2013.01); *H05K 5/0017* (2013.01); *A44C 5/0015* (2013.01); *G09G 2380/02* (2013.01); *H01L 2251/5338* (2013.01); *H05K 2201/056* (2013.01); *H05K 2201/10128* (2013.01)

(56) References Cited

U.S. PATENT DOCUMENTS

| | | | | |
|---|---|---|---|---|
| 7,737,911 | B2* | 6/2010 | Park | G09G 3/3674 |
| | | | | 345/1.1 |
| 9,128,337 | B2* | 9/2015 | Lee | G02F 1/13452 |
| 9,182,784 | B2* | 11/2015 | Yang | G06F 1/1601 |
| 9,733,751 | B2* | 8/2017 | Lo | G06F 1/1616 |
| 9,805,639 | B2* | 10/2017 | Kim | G09G 3/035 |
| 10,211,415 | B2* | 2/2019 | Kang | G06F 1/1652 |
| 10,338,641 | B2* | 7/2019 | Xia | A44C 5/00 |
| 2004/0217935 | A1* | 11/2004 | Jeon | G11C 19/28 |
| | | | | 345/100 |
| 2005/0052340 | A1* | 3/2005 | Goto | G09G 3/3611 |
| | | | | 345/1.3 |
| 2005/0146486 | A1* | 7/2005 | Lim | G09G 3/3611 |
| | | | | 345/1.1 |
| 2005/0151918 | A1* | 7/2005 | Park | G02F 1/13452 |
| | | | | 349/150 |
| 2006/0176254 | A1* | 8/2006 | Lee | G02F 1/13452 |
| | | | | 345/87 |
| 2007/0126654 | A1* | 6/2007 | Choi | G09G 3/3648 |
| | | | | 345/1.1 |
| 2008/0049170 | A1* | 2/2008 | Hwang | G09G 3/3648 |
| | | | | 349/69 |
| 2013/0010405 | A1 | 1/2013 | Rothkopf et al. | |
| 2014/0218321 | A1 | 8/2014 | Lee et al. | |
| 2015/0378662 | A1* | 12/2015 | Wan | G06F 1/1694 |
| | | | | 345/156 |
| 2016/0070303 | A1* | 3/2016 | Lee | G06F 1/1616 |
| | | | | 361/679.27 |
| 2016/0225830 | A1* | 8/2016 | Jang | G06F 1/1656 |
| 2016/0291745 | A1* | 10/2016 | Grip | G04G 17/045 |
| 2017/0123459 | A1* | 5/2017 | Song | G06F 1/163 |
| 2017/0139442 | A1 | 5/2017 | Yoshizumi | |
| 2017/0206863 | A1* | 7/2017 | An | G06F 3/0481 |
| 2018/0039303 | A1* | 2/2018 | Hashimoto | G02F 1/167 |
| 2018/0316783 | A1* | 11/2018 | Ye | H04M 1/0268 |
| 2019/0086952 | A1* | 3/2019 | Park | G06F 3/017 |
| 2019/0205011 | A1* | 7/2019 | Li | G06F 3/147 |
| 2019/0341566 | A1* | 11/2019 | Lee | H01L 51/0097 |

FOREIGN PATENT DOCUMENTS

| | | |
|---|---|---|
| CN | 204241854 U | 4/2015 |
| CN | 104867406 A | 8/2015 |
| CN | 104916231 A | 9/2015 |
| CN | 105137743 A | 12/2015 |
| CN | 105452983 A | 3/2016 |
| CN | 105676958 A | 6/2016 |
| CN | 106210178 A | 12/2016 |
| CN | 205899261 U | 1/2017 |
| CN | 107232700 A | 10/2017 |
| CN | 107979979 A | 5/2018 |
| CN | 108021191 A | 5/2018 |

OTHER PUBLICATIONS

First search from China patent office in a counterpart Chinese patent Application 201710439875.5, dated Jul. 5, 2018 (8 pages).

* cited by examiner

INTELLIGENT WEARABLE DEVICE

CROSS-REFERENCE TO RELATED APPLICATIONS

The present application is a 35 U.S.C. § 371 National Phase conversion of International (PCT) Patent Application No. PCT/CN2018/090817 filed on Jun. 12, 2018, which claims foreign priority of Chinese Patent Application No. 201710439875.5, filed on Jun. 12, 2017 in the National Intellectual Property Administration of China, the contents of all of which are hereby incorporated by reference.

TECHNICAL FIELD

The present disclosure relates to the technical field of electronic devices, in particular to an intelligent wearable device.

BACKGROUND

A smart watch in the technical field of wearable devices today is a device which connects an intelligent system built therein or a smart phone system installed therein to a network and realizes one or more functions of reminding, navigating, calibrating, monitoring, interacting and the like in addition to indicating time. Compared with a mobile phone, the smart watch is more convenient to be carried and has a considerable user base. Further, there are more and more users using smart bracelets with multiple functions such as health monitoring, timing reminding and data recording.

Due to the volume limitation of intelligent wearable devices, the screens currently used by the intelligent wearable devices bring the following bad experiences to users: (1) the screen size is very small, so it is necessary to reduce the font size in order to display more content on a screen, which causes the problem of unclear reading information; if the information is to be clearly seen, the font size will have to be increased, which results in less words displayed on the whole screen, page turning for many times, and inconvenience in information reading; (2) the screen size is very small, so operation is very inconvenient if content such as reply information is input.

Therefore, how to increase the screen size as much as possible under the condition that the overall volume of the device is small is an urgent problem to be solved in the technical field of intelligent wearable devices. In addition, while increasing the screen size, how to improve the endurance of intelligent wearable devices is also a problem to be solved.

SUMMARY

In view of this, the present disclosure provides an intelligent wearable device, which not only has a larger screen size, but also has an improved endurance capability.

In order to achieve the above purpose, the present disclosure adopts the following technical solution.

An intelligent wearable device, includes a housing and a display unit mounted on the housing, the display unit includes a first display screen and a second display screen. The first display screen is a flexible display screen, and the first display screen includes a first display area, a bendable area and a second display area which are sequentially connected. The first display area and the second display area are foldably connected to each other by means of the bendable area, and a back face of the first display area is connected to the housing. The second display screen is an electronic ink screen, and a back face of the second display screen is connected to a back face of the second display area in a laminated manner.

The intelligent wearable device may further include a mainboard, wherein the mainboard is encapsulated in the housing and relatively located below the first display area; the mainboard is connected with the first display screen through a first flexible circuit board; and the mainboard is connected with the second display screen through a second flexible circuit board.

The second flexible circuit board may extend out of the housing and along a back face of the bendable area to be connected to the second display screen.

The first display screen may be provided with a state detection unit for detecting a folding state of the first display area and the second display area, and the state detection unit sends folding a state signal to the mainboard through the first flexible circuit board.

The first display area and the second display area may have the same structural size, and when the second display area is folded toward the first display area, the second display area exactly covers the first display area completely.

An outer peripheral contour of the second display screen may not exceed an outer peripheral contour of the second display area.

The first display screen may be a flexible AMOLED display screen.

The intelligent wearable device may be a smart bracelet or a smart watch, and each of two opposite sides of the housing is connected with a wristband.

According to the intelligent wearable device provided by embodiments of the present disclosure, the display unit includes a first display screen and a second display screen. By arranging the foldable first display screen, the screen size is increased under the condition that the overall volume of the device is small, and when complete information, news document reports or pictures with more contents need to be displayed, the first display screen with larger size is driven to display, thus not only improving the display quality, but also making the user's operation more convenient. By arranging the second display screen using the electronic ink screen, when simple contents such as time, date, number of exercise steps, heart rate and the like need to be displayed, the second display screen is driven to display and the first display screen is turned off at this time, so that the power consumption of the device is reduced, and the endurance capability of the device is improved.

DETAILED DESCRIPTION

Figure 1:
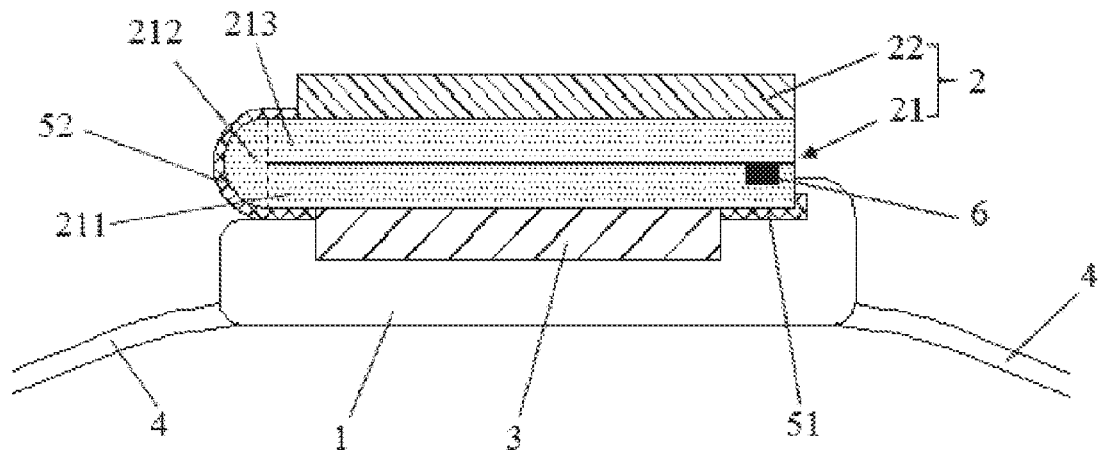
FIG. 1 is a schematic structural view of an intelligent wearable device provided by an embodiment of the present disclosure, wherein a first display screen is in a folded state.

In order to make objects, technical solutions and advantages of the present disclosure clearer, embodiments of the present disclosure will be described in detail below with reference to the accompanying drawings. Examples of these embodiments are illustrated in the accompanying drawings.

The embodiments of the present disclosure shown in the drawings and described in accordance with the drawings are merely exemplary, and the present disclosure is not limited to these embodiments.

Here, it should also be noted that, in order to avoid obscuring the present disclosure due to unnecessary details, only structures and/or processing steps closely related to the solutions according to the present disclosure are shown in the drawings, and other details not related to the present disclosure are omitted.

Figure 2:
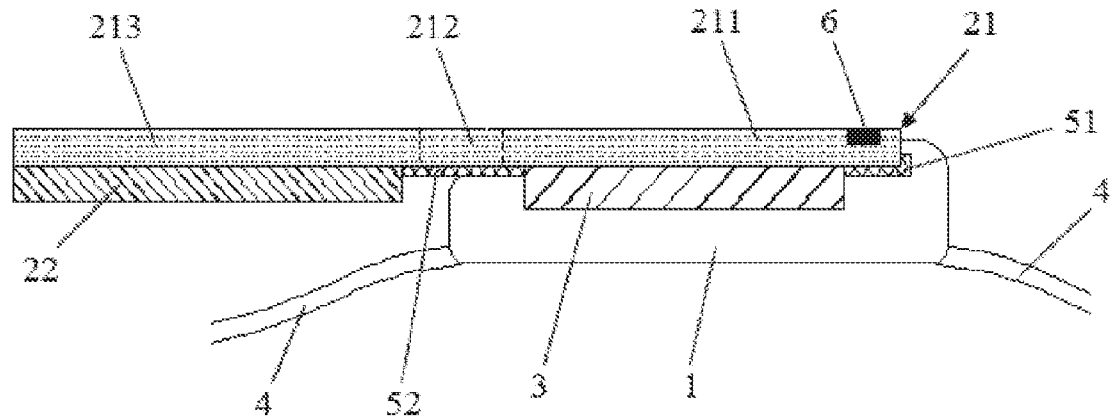
FIG. 2 is a schematic structural view of an intelligent wearable device provided by the embodiment of the present disclosure, wherein the first display screen is in an unfolded state.

An embodiment provides an intelligent wearable device. Referring to FIGS. 1 and 2, the intelligent wearable device includes a housing 1 and a display unit 2 mounted on the housing 1. The display unit 2 includes a first display screen 21 and a second display screen 22. The intelligent wearable device further includes a mainboard 3, which is encapsulated in the housing 1 and is relatively located below the display unit 2. The mainboard 3 provides driving signals to the first display screen 21 and the second display screen 22 to cause the first display screen 21 and the second display screen 22 to display pictures. The intelligent wearable device can be, for example, a smart bracelet or a smart watch, and each of the opposite sides of the housing 1 is connected with a wristband 4. Through a snap connection of the two wristbands 4, the intelligent wearable device can be worn on a user, for example, on a wrist.

Specifically, as shown in FIGS. 1 and 2, the first display screen 21 is a flexible display screen, such as a flexible AMOLED display screen. The first display screen 21 includes a first display area 211, a bendable area 212, and a second display area 213 that are sequentially connected. The first display area 212 and the second display area 213 are foldably connected to each other through the bendable area 212, and a back face (the side opposite to the display face) of the first display area 211 is connected to the housing 1. The second display screen 22 is an electronic ink screen, and a back face (the face opposite to the display face) of the second display screen 22 is connected to the back face of the second display area 213 in a laminated manner. When it is necessary to display complete information, news web pages with more contents, file reports or pictures or videos, the second display area 213 of the first display screen 21 is unfolded, and the mainboard 3 drives the first display area 211, the bendable area 212 and the second display area 213 of the first display screen 21 to display pictures together, that is, the intelligent wearable device at this time has a larger display screen, which not only improves the display quality, but also makes the user's operation more convenient. When only simple contents such as time, date, number of exercise steps, heart rate and the like need to be displayed, the second display area 213 of the first display screen 21 is folded on the first display area 211, and the mainboard drives the second display screen 22 to display and turns off the first display screen 21 at this time, thus reducing the power consumption of the device and improving the endurance capability of the device.

In this embodiment, as shown in FIGS. 1 and 2, the mainboard 3 is encapsulated in the housing 1 and relatively located below the first display area 211. The mainboard 3 is connected to the first display screen 21 through a first flexible circuit board 51, and the mainboard 3 is connected to the second display screen 22 through a second flexible circuit board 52. Specifically, the second flexible circuit board 52 extends out of the housing 1 and extends along a back face of the bendable area 212 to be connected to the second display screen 22.

Further, as shown in FIGS. 1 and 2, the first display screen 21 is provided with a state detection unit 6, which is provided in the first display area 211 in an embodiment. The state detection unit 6 is configured to detect a folding state of the first display area 211 and the second display area 213. The state detection unit 6 sends a folding state signal to the mainboard 3 through the first flexible circuit board 51. The mainboard 3 selectively drives the first display screen 21 or the second display screen 22 to display pictures according to the folding state signal. Specifically, when the second display area 213 is folded over the first display area 211, the state detection unit 6 sends an electrical signal indicating the folded state to the mainboard 3, at which time the mainboard 3 turns off the first display screen 21 and turns on the second display screen 22 according to the signal. When the second display area 213 is unfolded from the first display area 211, the state detection unit 6 sends an electrical signal indicating the unfolded state to the mainboard 3, and the mainboard 3 turns on the first display screen 21 and turns off the second display screen 22 according to the signal. By automatically detecting the state to control the selection of the first display screen 21 or the second display screen 22 to be displayed, the power consumption of the device is further reduced, and the endurance time of the device is increased. Under the condition that the battery capacity of the intelligent wearable device is limited, this effect is even more prominent.

Further, in an embodiment, the first display area 211 and the second display area 213 have the same structural size, and when the second display area 213 is folded toward the first display area 211, the second display area 213 exactly covers the first display area completely 211. In addition, an outer peripheral contour of the second display screen 22 is designed not to exceed an outer peripheral contour of the second display area 213. This arrangement makes the intelligent wearable device more compact in structure, more aesthetic in appearance, and improves the competitiveness of products.

In summary, the intelligent wearable device provided by the embodiment of the present disclosure obtains a larger screen size under the condition that the overall volume of the device is small by arranging the foldable first display screen; by arranging the second display screen using the electronic ink screen, when simple contents such as time, date, number of exercise steps, heart rate and the like need to be displayed, the second display screen is driven to display and the first display screen is turned off at this time, so that the power consumption of the device is reduced, and the endurance capability of the device is improved.

It should be noted that, in this document, relational terms such as first, second and the like are only used to distinguish one entity or operation from another entity or operation, and do not necessarily require or imply any such actual relationship or order between these entities or operations. Moreover, the terms "comprise," "include," or any other variation thereof are intended to cover a non-exclusive inclusion, such that a process, method, article, or device that comprises a list of elements not only include those elements but also can include other elements not expressly listed or inherent to such process, method, article, or device. Without further limitation, an element defined by the statement "includes an . . . " does not exclude the presence of another identical element in a process, method, article or device that includes the element.

The above description is only a specific embodiment of this application. It should be pointed out that, for a person of ordinary skill in the technical field, several improvements and embellishments can be made without departing from the principles of this application. These improvements and embellishments should also be regarded as falling within the protection scope of this application.

The invention claimed is:

1. An intelligent wearable device, comprising a housing and a display unit mounted on the housing, wherein the display unit comprises a first display screen and a second display screen, the first display screen is a flexible display screen; the first display screen comprises a first display area, a bendable area and a second display area which are sequentially connected; the first display area and the second display area are foldably connected to each other by means of the bendable area, a back face of the first display area is connected to the housing; the second display screen is an electronic ink screen, and a back face of the second display screen is connected to a back face of the second display area in a laminated manner; wherein the intelligent wearable device further comprise a mainboard, a first flexible circuit board, and a second flexible circuit board; the first flexible circuit board and the second flexible circuit board are respectively connected to two opposite sides of the main board, the second flexible circuit board is attached on the bendable area, and the mainboard is connected with the first display screen through the first flexible circuit board and is connected with the second display screen through the second flexible circuit board.

2. The intelligent wearable device according to claim 1, wherein the intelligent wearable device is a smart bracelet or a smart watch, and each of two opposite sides of the housing is connected with a wristband.

3. The intelligent wearable device according to claim 1, wherein an outer peripheral contour of the second display screen does not exceed an outer peripheral contour of the second display area.

4. The intelligent wearable device according to claim 1, wherein the first display screen is a flexible AMOLED display screen.

5. The intelligent wearable device according to claim 1, wherein the mainboard is encapsulated in the housing and relatively located below the first display area.

6. The intelligent wearable device according to claim 5, wherein the second flexible circuit board extends out of the housing and extends along a back face of the bendable area to be connected to the second display screen.

7. The intelligent wearable device according to claim 5, wherein the first display screen is provided with a state detection unit for detecting a folding state of the first display area and the second display area, and the state detection unit is configured to send a folding state signal to the mainboard through the first flexible circuit board.

8. The intelligent wearable device according to claim 1, wherein the first display area and the second display area have the same structural size, and when the second display area is folded toward the first display area, the second display area exactly covers the first display area completely.

9. An intelligent wearable device, comprising a housing and a display unit mounted on the housing, wherein the display unit comprises a first display screen and a second display screen, the first display screen is a flexible display screen; the first display screen comprises a first display area, a bendable area and a second display area which are sequentially connected; the first display area and the second display area are foldably connected to each other by means of the bendable area, a back face of the first display area is connected to the housing, and a back face of the second display screen is connected to a back face of the second display area in a laminated manner; wherein the intelligent wearable device further comprise a mainboard, a first flexible circuit board, and a second flexible circuit board; the first flexible circuit board and the second flexible circuit board are respectively connected to two opposite sides of the main board, the second flexible circuit board is attached on the bendable area, and the mainboard is connected with the first display screen through the first flexible circuit board and is connected with the second display screen through the second flexible circuit board.

10. The intelligent wearable device according to claim 9, wherein the second display screen is an electronic ink screen.

11. The intelligent wearable device according to claim 9, wherein the mainboard is encapsulated in the housing and relatively located below the first display area.

12. The intelligent wearable device according to claim 11, wherein the second flexible circuit board extends out of the housing and extends along a back face of the bendable area to be connected to the second display screen.

13. The intelligent wearable device according to claim 11, wherein the first display screen is provided with a state detection unit for detecting a folding state of the first display area and the second display area, and the state detection unit is configured to send a folding state signal to the mainboard through the first flexible circuit board.

14. The intelligent wearable device according to claim 9, wherein the first display area and the second display area have the same structural size, and when the second display area is folded toward the first display area, the second display area exactly covers the first display area completely.

15. The intelligent wearable device according to claim 9, wherein the intelligent wearable device is a smart bracelet or a smart watch, and each of two opposite sides of the housing is connected with a wristband.

16. The intelligent wearable device according to claim 9, wherein an outer peripheral contour of the second display screen does not exceed an outer peripheral contour of the second display area.

17. The intelligent wearable device according to claim 9, wherein the first display screen is a flexible AMOLED display screen.

18. An intelligent wearable device, comprising a housing and a display unit mounted on the housing, wherein the display unit comprises a first display screen and a second display screen, the first display screen comprises a first display area, a bendable area and a second display area which are sequentially connected; the first display area and the second display area are foldably connected to each other by means of the bendable area, a back face of the first display area is connected to the housing, and a back face of the second display screen is connected to a back face of the second display area in a laminated manner; wherein the intelligent wearable device further comprise a mainboard, a first flexible circuit board, and a second flexible circuit board; the first flexible circuit board and the second flexible circuit board are respectively connected to two opposite sides of the main board, the second flexible circuit board is attached on the bendable area, and the mainboard is connected with the first display screen through the first flexible circuit board and is connected with the second display screen through the second flexible circuit board.

19. The intelligent wearable device according to claim 18, wherein the first display screen is a flexible AMOLED display screen, and the second display screen is an electronic ink screen.

* * * * *